(12) United States Patent
Nakayama

(10) Patent No.: US 8,585,184 B2
(45) Date of Patent: Nov. 19, 2013

(54) PIEZOELECTRIC ELEMENT, PIEZOELECTRIC ACTUATOR, LIQUID EJECTING HEAD, AND LIQUID EJECTING APPARATUS

(75) Inventor: Masao Nakayama, Shiojiri (JP)

(73) Assignee: Seiko Epson Corporation, Tokyo (JP)

( * ) Notice: Subject to any disclaimer, the term of this patent is extended or adjusted under 35 U.S.C. 154(b) by 103 days.

(21) Appl. No.: 13/225,107

(22) Filed: Sep. 2, 2011

(65) Prior Publication Data

US 2012/0056945 A1 Mar. 8, 2012

(30) Foreign Application Priority Data

Sep. 6, 2010 (JP) ................................. 2010-199089

(51) Int. Cl.
*B41J 2/045* (2006.01)
(52) U.S. Cl.
USPC .......................................................... 347/68
(58) Field of Classification Search
None
See application file for complete search history.

(56) References Cited

U.S. PATENT DOCUMENTS 6,089,701 A 7/2000 Hashizume et al.
2010/0265301 A1* 10/2010 Takakuwa ....................... 347/71

FOREIGN PATENT DOCUMENTS

JP 10-226071 A 8/1998

* cited by examiner

*Primary Examiner* — Matthew Luu
*Assistant Examiner* — Erica Lin
(74) *Attorney, Agent, or Firm* — Kilpatrick Townsend & Stockton LLP

(57) ABSTRACT

A piezoelectric element according to an embodiment of the invention includes a first electrode containing a noble metal, a first multilayer composite disposed on the first electrode, a second multilayer composite disposed on the first electrode with a distance from the first multilayer composite, an oxide film partly disposed on the surface of the first electrode between the first multilayer composite and the second multilayer composite, and a covering layer. The covering layer covers the side surfaces of the first and second multilayer composites, and the oxide film and the surface of the first electrode between the first multilayer composite and the second multilayer composite. The first multilayer composite and the second multilayer composite each include a piezoelectric layer, and a second electrode over the piezoelectric layer.

19 Claims, 11 Drawing Sheets

PIEZOELECTRIC ELEMENT, PIEZOELECTRIC ACTUATOR, LIQUID EJECTING HEAD, AND LIQUID EJECTING APPARATUS

This application claims a priority to Japanese Patent Application No. 2010-199089 filed on Sep. 6, 2010 which is hereby expressly incorporated by reference herein in its entirety.

BACKGROUND

1. Technical Field

The present invention relates to a piezoelectric element, a piezoelectric actuator, a liquid ejecting head, and a liquid ejecting apparatus.

2. Related Art

Piezoelectric elements are deformed according to the voltage applied thereto, and have a structure in which a piezoelectric layer is disposed between electrodes. Piezoelectric elements are used in liquid ejecting heads of ink jet printers, and other various devices such as actuators.

The piezoelectric layer of the piezoelectric element is liable to be degraded by moisture or the like. In order to prevent the degradation of the piezoelectric layer caused by moisture from the atmosphere, for example, the ink jet recording head disclosed in JP-A-10-226071 is provided with a protective film over the side surfaces of the piezoelectric layer and the upper surface of the lower electrode.

In order to enhance the reliability of the piezoelectric element having such a structure, it is important to enhance the adhesion between the protective film and each of the piezoelectric layer and the lower electrode. If the lower electrode is made of a noble metal, such as platinum (Pt) or iridium (Ir), the adhesion between the lower electrode and the protective film is reduced because these metals are not reactive. If the adhesion between the protective film and the piezoelectric layer or the lower electrode is insufficient, the protective film may be removed from the piezoelectric layer or the lower electrode, or may separate to form a space between the protective film and the piezoelectric layer or lower electrode. Such removal or separation causes a defect in the protective film, and consequently, the protective film cannot maintain its function as a barrier. Thus, the reliability of the piezoelectric element may be reduced.

SUMMARY

An advantage of some aspects of the invention is that it provides a highly reliable piezoelectric element. Also, another advantage of the invention is that it provides a piezoelectric actuator, a liquid ejecting head and a liquid ejecting apparatus each including the piezoelectric element.

A piezoelectric element according to an embodiment of the invention include a first electrode containing a noble metal, a first multilayer composite disposed on the first electrode, a second multilayer composite disposed on the first electrode with a distance from the first multilayer composite, an oxide film partly disposed on the surface of the first electrode between the first multilayer composite and the second multilayer composite, and a covering layer. The covering layer covers the side surfaces of the first and second multilayer composites, and the oxide film and the surface of the first electrode between the first multilayer composite and the second multilayer composite. The first multilayer composite and the second multilayer composite each include a piezoelectric layer and a second electrode over the piezoelectric layer.

In this piezoelectric element, an oxide film is partly formed on the surface of the first electrode between the first and second multilayer composites. The oxide film protrudes from the first electrode by the thickness thereof. Consequently, the contact area of the first electrode with the covering layer or protective film is increased relative to the case where the oxide film is not formed. Accordingly, the adhesion to the covering layer is increased to ensure high reliability.

Thus, by partly forming the oxide film 50 on the surface of the first electrode, the region having higher adhesion to the covering layer can be increased to reduce the region having lower adhesion to the covering layer. Accordingly, the adhesion to the covering layer is increased to ensure high reliability.

In the description, expressions using the preposition "on", for example, "A is disposed on B", means that A lies on B directly or with something therebetween.

The first multilayer composite and the second multilayer composite may each further include a conductive layer that is disposed between the first electrode and the piezoelectric layer, and the oxide film and the conductive layer are made of the same material.

Thus, the conductive layer and the oxide film can be formed in the same process step. Accordingly, the manufacturing process of the piezoelectric element can be simplified.

The oxide film may include a film containing iridium oxide, a film containing lanthanum and nickel, or a film containing strontium and ruthenium.

This structure can enhance the adhesion between the covering layer and the oxide film, so that the piezoelectric element can exhibit high reliability.

Alternatively, the oxide film and the piezoelectric layer are made of the same material.

Thus, the piezoelectric layer and the oxide film can be formed in the same process step. Accordingly, the manufacturing process of the piezoelectric element can be simplified.

The oxide film may have an incline defined by continuous changes in the thickness thereof.

This structure can further enhance the adhesion between the covering layer and the oxide film. If the thickness of the oxide film does not change continuously, that is, if the thickness of the oxide film changes acutely, a stress is placed on the covering layer covering the oxide film and may result in a reduced adhesion between the covering layer and the oxide film. Since this problem does not occur in the piezoelectric element of an embodiment of the invention, the adhesion between the covering layer and the oxide film can be enhanced.

The oxide film may have a projecting shape having an apex, and includes a first portion whose thickness is reduced toward the first multilayer composite from the apex, and a second portion whose thickness is reduced toward the second multilayer composite from the apex. The first portion has an incline defined by continuous changes in the thickness thereof, and the second portion has an incline defined by continuous changes in the thickness thereof.

This structure can further enhance the adhesion between the covering layer and the oxide film. If the thickness of the oxide film is acutely changed, a stress is placed on the covering layer covering the oxide film, and the adhesion between the covering layer and the oxide film may be reduced. Since this problem does not occur in the piezoelectric element of an embodiment of the invention, the adhesion between the covering layer and the oxide film can be enhanced.

A piezoelectric actuator according to another embodiment of the invention includes the piezoelectric element.

Since the piezoelectric actuator includes the piezoelectric element describe above, the actuator can exhibit high reliability.

A liquid ejecting head according to an embodiment of the invention includes the piezoelectric actuator.

Since the liquid ejecting head includes the piezoelectric actuator, the head can exhibit high reliability.

A liquid ejecting apparatus according to an embodiment of the invention includes the liquid ejecting head.

Since the liquid ejecting apparatus includes the liquid ejecting head, the apparatus can exhibit high reliability.

BRIEF DESCRIPTION OF THE DRAWINGS

The invention will be described with reference to the accompanying drawings, wherein like numbers reference like elements.

DESCRIPTION OF EXEMPLARY EMBODIMENTS

Preferred embodiments of the invention will now be described with reference to the drawings.

1. Piezoelectric Element

Figure 1:
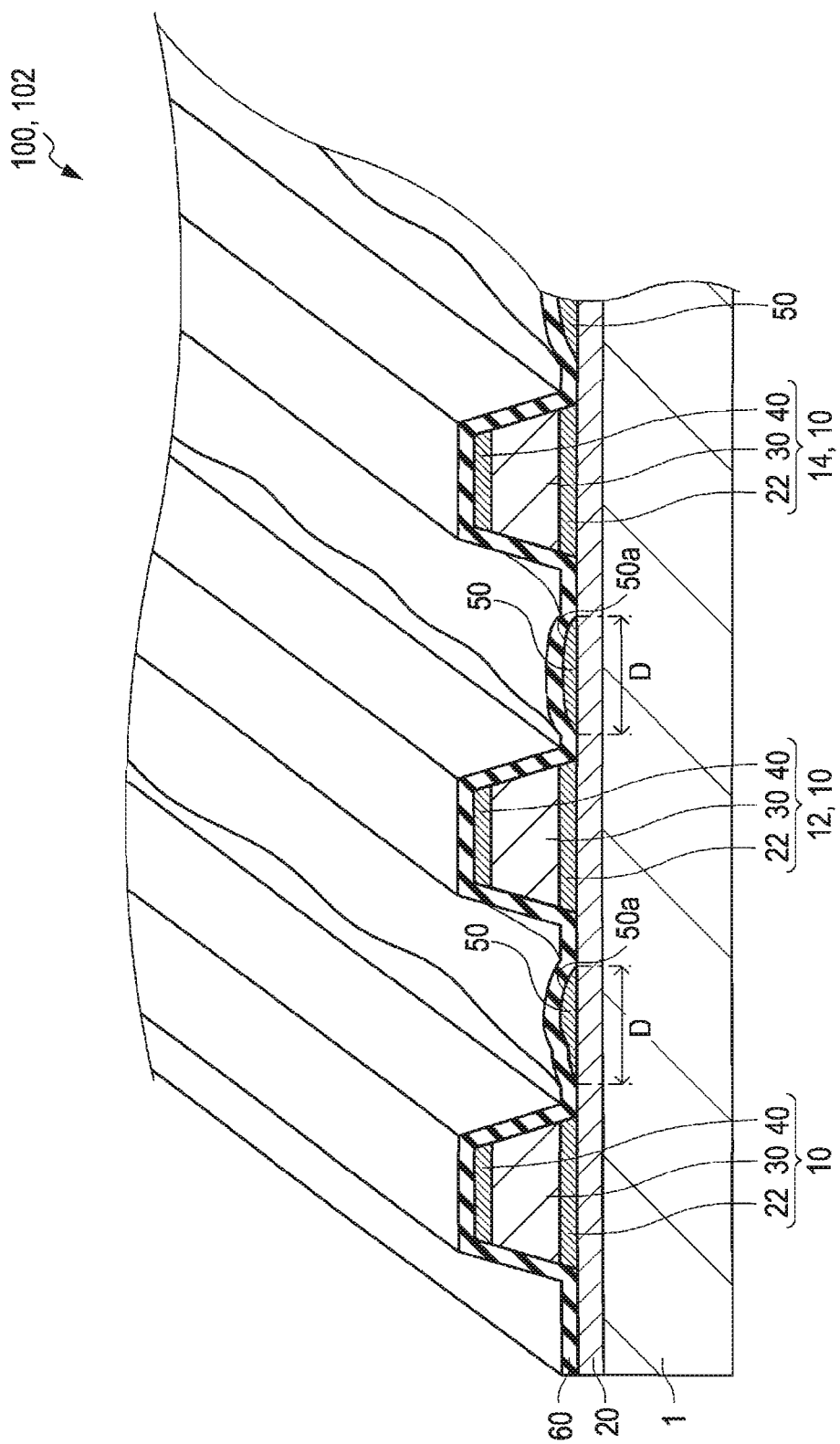
FIG. 1 is a schematic sectional view of a piezoelectric element according to an embodiment of the invention.

A piezoelectric element according to an embodiment of the invention will now be described with reference to some drawings. FIG. 1 is a schematic sectional view of the piezoelectric element 100.

As shown in FIG. 1, the piezoelectric element 100 includes a first electrode 20, multilayer composites 10, oxide films 50 and a covering layer 60. Each multilayer composite 10 may include a conductive layer 22, a piezoelectric layer 30, and a second electrode 40. The piezoelectric element 100 is formed on a substrate 1.

The substrate 1 is a flat plate made of, for example, a semiconductor or an insulating material. The substrate 1 may be composed of a single layer or a plurality of layers. The substrate 1 may have any internal structure as long as the upper surface is flat, and may be a hollow plate.

The substrate 1 may include a flexible vibration plate that can be deformed (bent) by the behavior of the piezoelectric layer 30. In this instance, the piezoelectric element 100 can act as a piezoelectric actuator 102. The substrate 1 may be used as part of the wall partitioning pressure chambers. In the use of the piezoelectric actuator 102 in a liquid ejecting head, the capacity of the pressure chambers can be varied by the bending of the substrate 1 (vibration plate). If the substrate 1 includes a vibration plate, the vibration plate can be made of an inorganic compound, such as zirconium oxide ($ZrO_2$), silicon nitride or silicon oxide, or an alloy, such as stainless steel. The vibration plate may be composed of a single layer or a plurality of layers made of different materials.

The substrate 1 may not include the vibration plate, and, instead, the first electrode 20 may act as the vibration plate. In other words, the first electrode 20 may have a function as one of the electrodes for applying a voltage to the piezoelectric layer 30 and a function as a vibration plate that can be deformed by the behavior of the piezoelectric layer 30. In this case as well, the piezoelectric element 100 can act as a piezoelectric actuator 102.

The first electrode 20 is formed on the substrate 1. The first electrode 20 and the substrate 1 may be separated by an additional layer (not shown), such as a layer enhancing the adhesion between the first electrode 20 and the substrate 1 or a layer enhancing strength or imparting conductivity.

The first electrode 20 may be in the form of a layer or a thin film. The first electrode 20 has a thickness, for example, in the range of 50 to 300 nm. The shape of the first electrode 20 is not particularly limited as long as the piezoelectric layer 30 can be disposed between the first electrode 20 and the opposing second electrode 40. The first electrode 20 may have a smooth surface. The surface of the first electrode between the multilayer composites 10 (for example, between the first multilayer composite 12 and the second multilayer composite 14) is not covered with the conductive layer 22 or the piezoelectric layer 30.

The first electrode 20 contains a noble metal. More specifically, the first electrode 20 contains at least one element selected from the group consisting of gold, silver, and palladium metals (ruthenium, rhodium, palladium, osmium, iridium, and platinum). The main constituent of the first electrode 20 may be a noble metal. The first electrode 20 may further contain another element in addition to the noble metal.

One of the functions of the first electrode 20 is to form a pair with the second electrode 40 so as to act as one of the electrodes (for example, a lower electrode disposed under the piezoelectric layer 30) for applying a voltage to the piezoelectric layer 30. The first electrode 20 may be a common electrode of the multilayer composites 10. More specifically, the first electrode 20 for applying a voltage to the first multilayer composite 12 may be electrically connected to the first electrode 20 for applying a voltage to the second multilayer composite 14. In the structure shown in FIG. 1, the first electrode 20 for applying a voltage to the first multilayer composite 12 and the first electrode 20 for applying a voltage to the second multilayer composite 14 are formed in one body as a common electrode.

The multilayer composites 10 are disposed on the first electrode 20. Although FIG. 1 shows three multilayer composites 10, the number of the multilayer composites 10 is not particularly limited. The multilayer composites 10 are separate from each other, and may be arranged in parallel in the direction of the width of the second electrode 40. Hence, in this instance, the width direction of the second electrode 40 is a direction in which the multilayer composites 10 are arranged in parallel with each other (arrangement direction). In the piezoelectric element 100, the width direction of the multilayer composite (the conductive layer 22, the piezoelectric layer 30 and the second electrode 40) 10 is parallel to the arrangement direction, and the length of the multilayer composite 10 is perpendicular to the arrangement direction.

The conductive layer 22 is formed on the first electrode 20. More specifically, the conductive layer 22 is disposed between the first electrode 20 and the piezoelectric layer 30. The conductive layer 22 may be a layer containing iridium oxide ($IrO_2$), a layer containing strontium and ruthenium, or a layer containing ruthenium and nickel. The layer containing strontium and ruthenium may be a strontium-ruthenium complex oxide ($SrRuO_x$, abbreviated as SRO) layer. The layer containing lanthanum and nickel may be a lanthanum-nickel complex oxide ($LaNiO_x$, abbreviated as LNO) layer. The function of the conductive layer 22 is, in part, to control the orientation of the piezoelectric layer 30.

The piezoelectric layer 30 is formed on the conductive layer 22. In other words, the piezoelectric layer 30 is disposed on the first electrode 20 with the conductive layer 22 therebetween. The piezoelectric layer 30 has a thickness, for example, in the range of 300 to 3000 nm.

The piezoelectric layer 30 is formed of a piezoelectric material. The piezoelectric layer 30 can be deformed by applying a voltage from the first electrode 20 and the second electrode 40. When the piezoelectric element 100 is configured to be a piezoelectric actuator 102, the vibration plate of the piezoelectric actuator 102 can be deformed (bent) by the deformation of the piezoelectric layer 30.

The piezoelectric layer 30 is preferably made of a perovskite-type oxide expressed by the general formula $ABO_3$ (for example, A may be Pb, and B may be Zr and Ti). Examples of such a perovskite-type oxide include lead zirconate titanate ($Pb(Zr,Ti)O_3$, abbreviated as PZT), lead zirconate titanate niobate ($Pb(Zr,Ti,Nb)O_3$), barium titanate ($BaTiO_3$), and potassium sodium niobate ($(K,Na)NbO_3$).

The second electrode 40 is formed over the piezoelectric layer 30. The second electrode 40 opposes the first electrode 20. The second electrode 40 may be in the form of a layer or a thin film. The second electrode 40 has a thickness, for example, in the range of 50 to 300 nm. The shape of the second electrode 40 is not particularly limited as long as the piezoelectric layer 30 can be disposed between the opposing first electrode 20 and the second electrode 40. In the embodiment shown in the drawings, the second electrode 40 is rectangular in plan view.

The second electrode 40 may be made of a metal, such as nickel, iridium or platinum, a conductive oxide of these metals, such as iridium oxide, a complex oxide of strontium and ruthenium ($SrRuO_x$, abbreviated as SRO), or a complex oxide of lanthanum and nickel ($LaNiO_x$, abbreviated as LNO). The second electrode 40 may be composed of a single layer made of any of the above materials, or a plurality of layers made of some of the above materials.

One of the functions of the second electrode 40 is to form a pair with the first electrode 20 so as to act as one of the electrodes (for example, an upper electrode disposed over the piezoelectric layer 30) for applying a voltage to the piezoelectric layer 30. The second electrode 40 may be a discrete electrode provided for each multilayer composite 10. More specifically, the second electrode 40 of the first multilayer composite 12 is electrically independent from the second electrode 40 of the second multilayer composite 14.

The oxide films 50 are partly formed on the surface of the first electrode 20 between the multilayer composites 10 (for example, between the first multilayer composite 12 and the second multilayer composite 14). In the embodiment shown in FIG. 1, the oxide films 50 are partly disposed in regions on the surface of the first electrode 20 not covered with the conductive layers 22 or the piezoelectric layers 30. In other words, the surface of the first electrode 20 includes regions over which the oxide films 50 are disposed, and regions that are not provided with the oxide film 50. If the entire surface of the first electrode 20 is covered with the oxide films 50 (and the conductive layers 22), an external terminal (not shown) that is to be electrically connected to the first electrode 20 is formed with the oxide film 50 therebetween. In this instance, however, the external terminal is oxidized at the contact area with the oxide film 50 by the oxide film 50, and the resistance of the connection between the first electrode 20 and the external terminal is increased. Since the piezoelectric element 100 has the first electrode 20 including regions not covered with the oxide films 50, the resistance of the connection between the first electrode 20 and the external terminal can be reduced relative to the case where the entire surface of the first electrode 20 is covered with the oxide films 50.

Figure 2:
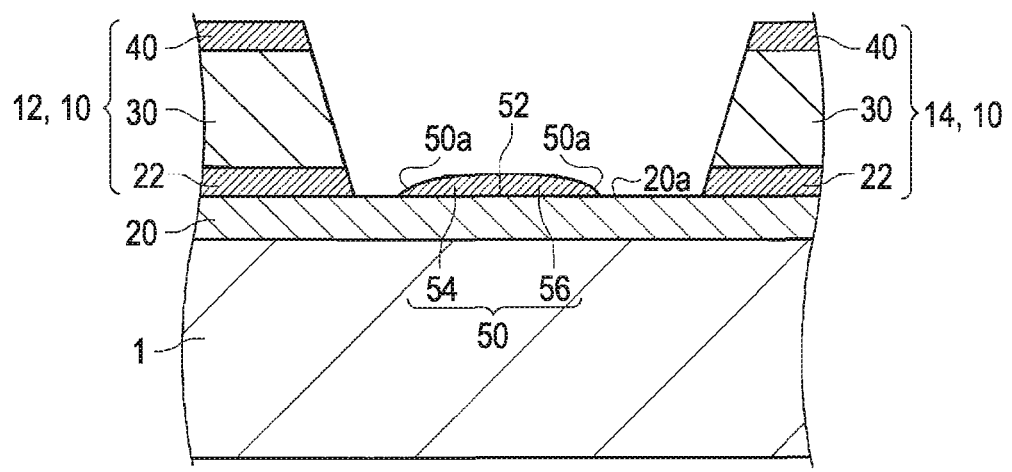
FIG. 2 is a schematic sectional view showing main parts of the piezoelectric element according to the embodiment of the invention.

FIG. 2 is a schematic sectional view showing main parts of the piezoelectric element 100, and particularly shows the region between adjacent two multilayer composites 10 (the first multilayer composite 12 and the second multilayer composite 14). For the sake of convenience, the covering layer 60 is not shown in FIG. 2. The oxide film 50 has an incline 50a defined by continuous changes in its thickness. Hence, the thickness of the oxide film 50 gradually changes without changing so acutely as to form steps. If the thickness of the oxide film 50 changes acutely, a stress is placed on the covering layer 60 covering the oxide films 50, and the adhesion of the covering layer may be reduced. Since the oxide film 50 has the incline 50a, the adhesion between the covering layer 60 and the oxide film 50 can be enhanced. In the embodiment shown in FIG. 2, the entire surface of the oxide film 50 that is to come into contact with the covering layer 60 forms the incline 50a. The incline 50a may continue to the surface 20a of the first electrode 20. Thus, such an acute change in thickness as to form a step height does not occur at the boundary between the oxide film 50 and the first electrode 20. The oxide film 50 may have a portion having a flat surface (a portion having a constant thickness, not shown). The oxide film 50 has a thickness, for example, in the range of 5 to 100 nm.

The oxide film 50 protrudes from the first electrode 20 by the thickness thereof. The oxide film 50 may have a projecting shape having an apex 52. The apex 52 mentioned herein refers to a point on the oxide film 50 at which the distance from the surface 20a of the first electrode 20 is maximum. The position of the apex 52 is not particularly limited as long as it lies between the multilayer composites 10. For example, the distance from the first multilayer composite 12 to the apex 52 may be the same as the distance from the second multilayer composite 14 to the apex 52 when viewed from above. As shown in FIG. 2, the oxide film 50 has a first portion 54 whose thickness is gradually reduced toward the first multilayer composite 12 from the apex 52, and a second portion 56 whose thickness is reduced toward the second multilayer composite 14 from the apex 52. In other words, the first portion 54 and the second portion 56 are tapered. The first portion 54 of the oxide film 50 lies to the first multilayer composite 12 side of the oxide film 50 and the second portion 56 lies to the second multilayer composite 14 side. The first portion 54 has an incline 50a defined by the continuous changes in the thickness thereof, and the second portion 56 has an incline 50a defined by the continuous changes in the thickness thereof.

In the embodiment shown in FIG. 2, the oxide film 50 is separate from the multilayer composites 10. As shown in FIG. 1, the width (distance from one side to the other in the direction along the shorter side of the multilayer composite 10) D of the oxide film 50 may vary from position to position. Alternatively, the width D of the oxide film 50 may be constant.

The oxide film 50 may be made of the same material as the conductive layer 22. More specifically, the oxide film 50 may be a film containing iridium oxide ($IrO_2$), a film containing strontium and ruthenium, or a film containing ruthenium and nickel. The film containing strontium and ruthenium may be a strontium-ruthenium complex oxide (SrRuOx, abbreviated as SRO) film. The film containing lanthanum and nickel may be a lanthanum-nickel complex oxide (LaNiOx, abbreviated as LNO) film. However, the oxide film 50 can be made of any material without being limited to the same material as the conductive layer 22, as long as the oxide film 50 can establish a higher adhesion to the covering layer 60 than the first electrode containing a noble metal. The oxide film 50 may have a single-layer structure or a multilayer structure.

The covering layer 60 covers at least the side surfaces of the multilayer composites 10, the surface of the first electrode 20 between the multilayer composites 10 (for example, between the first multilayer composite 12 and the second multilayer composite 14), and the oxide films 50. In the embodiment shown in FIG. 1, the covering layer 60 covers also the upper surfaces of the multilayer composites 10. One of the functions of the covering layer 60 is to alleviate or prevent the degradation of the piezoelectric layer 30 resulting from the absorption of moisture from the atmosphere. In other words, the covering layer 60 can protect the piezoelectric layers 30 from moisture or the like.

The covering layer 60 can be made of silicon oxide ($SiO_2$), aluminum oxide ($Al_2O_3$), or a known organic material. Examples of the known organic material include photoresists and resin compositions containing polyimide, benzocyclobutene (BCB) or polyvinyl alcohol derivatives.

The piezoelectric element 100 may have the following features.

The piezoelectric element 100 has the oxide films 50 partly on the surface of the first electrode 20 between the multilayer composites 10. The oxide film 50 protrudes from the first electrode 20 by the thickness thereof. Consequently, the contact area of the first electrode 20 with the covering layer 60 is increased relative to the case where the oxide film 50 is not formed. Accordingly, the adhesion to the covering layer 60 is increased to ensure high reliability.

In addition, the oxide film 50 may be a film containing iridium oxide ($IrO_2$), a film containing strontium and ruthenium, or a film containing ruthenium and nickel. These materials have higher adhesion to the materials that can be used in the covering layer 60, such as silicon oxide ($SiO_2$), aluminum oxide ($Al_2O_3$) and known organic materials, than noble metals that can be used in the first electrode 20. Thus, by partly forming the oxide films 50 on the surface 20a of the first electrode 20, the regions having higher adhesion to the covering layer 60 can be increased in area to reduce the area of regions having lower adhesion to the covering layer 60. Thus, the adhesion to the covering layer 60 is increased to ensure high reliability.

In the piezoelectric element 100, the multilayer composite 10 has the conductive layer 22 that is disposed between the first electrode 20 and the piezoelectric layer 30. The oxide film 50 is made of the same material as the conductive layer 22. Accordingly, the conductive layers 22 and the oxide films 50 can be formed in the same process step, and, thus, the manufacturing process can be simplified.

The oxide film 50 is a film containing iridium oxide, a film containing lanthanum and nickel, or a film containing strontium and ruthenium. These materials exhibit higher adhesion to the covering layer 60 than the noble metal of the first electrode 20. Accordingly, the adhesion between the covering layer 60 and the oxide films 50 is increased to ensure high reliability.

The oxide film 50 has an incline 50a defined by the continuous changes in its thickness. Thus, the adhesion between the covering layer 60 and the oxide film 50 can be enhanced. If the thickness of the oxide film 50 does not change continuously, that is, if the thickness of the oxide film 50 changes acutely, a stress is placed on the covering layer 60 covering the oxide film 50 and may result in reduced adhesion between the covering layer 60 and the oxide film 50. Since this problem does not occur in the piezoelectric element 100, the adhesion between the covering layer 60 and the oxide film 50 can be enhanced.

The oxide film 50 has a projecting shape having an apex 52, and the oxide film 50 has the first portion 54 whose thickness is reduced toward the first multilayer composite 12 from the apex 52 and the second portion 56 whose thickness is reduced toward the second multilayer composite 14 from the apex 52. The first portion 54 has an incline 50a defined by the continuous changes in the thickness thereof, and the second portion 56 has an incline 50a defined by the continuous changes in the thickness thereof. Thus, the adhesion between the covering layer 60 and the oxide film 50 can be enhanced. If the thickness of the oxide film 50 does not change continuously, that is, if the thickness of the oxide film 50 changes acutely, stress is placed on the covering layer 60 covering the oxide film 50 and may result in reduced adhesion between the covering layer 60 and the oxide film 50. Since this problem does not occur in the piezoelectric element 100, the adhesion between the covering layer 60 and the oxide film 50 can be enhanced.

2. Method for Manufacturing the Piezoelectric Element

Figure 3:
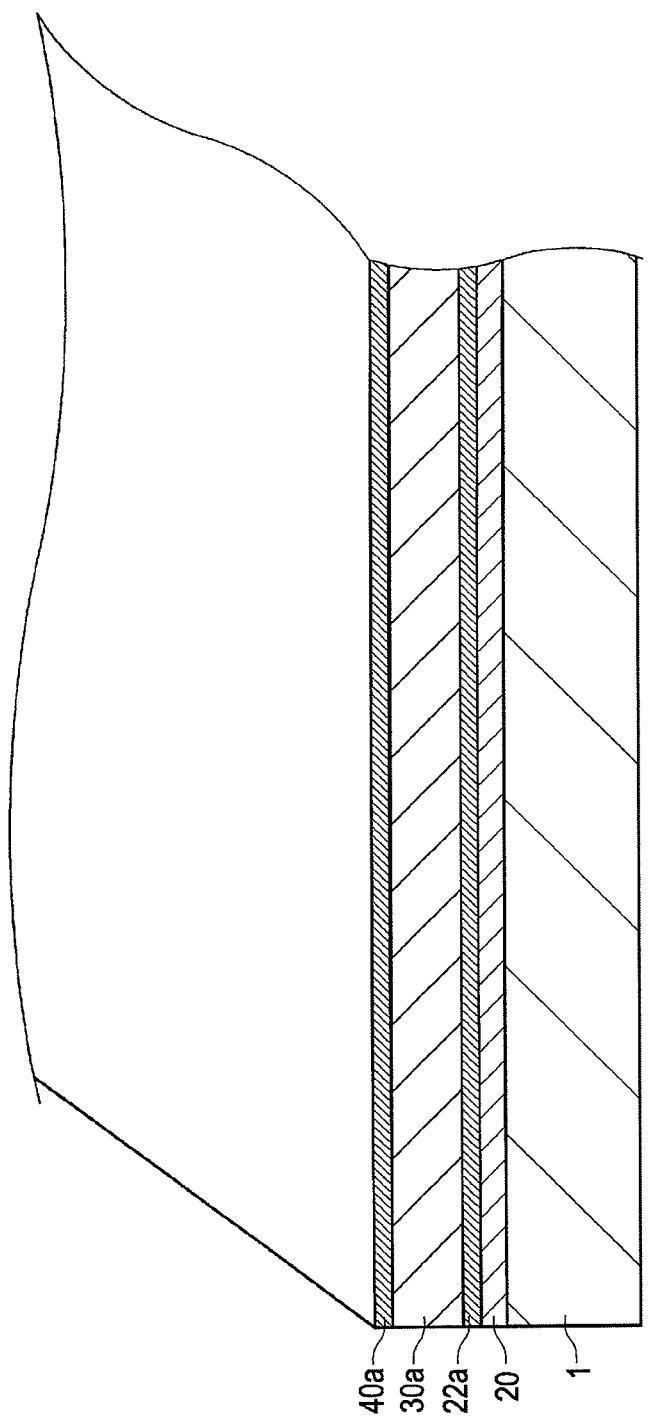
FIG. 3 is a schematic sectional view showing a method for manufacturing the piezoelectric element according to an embodiment of the invention.
Figure 4:
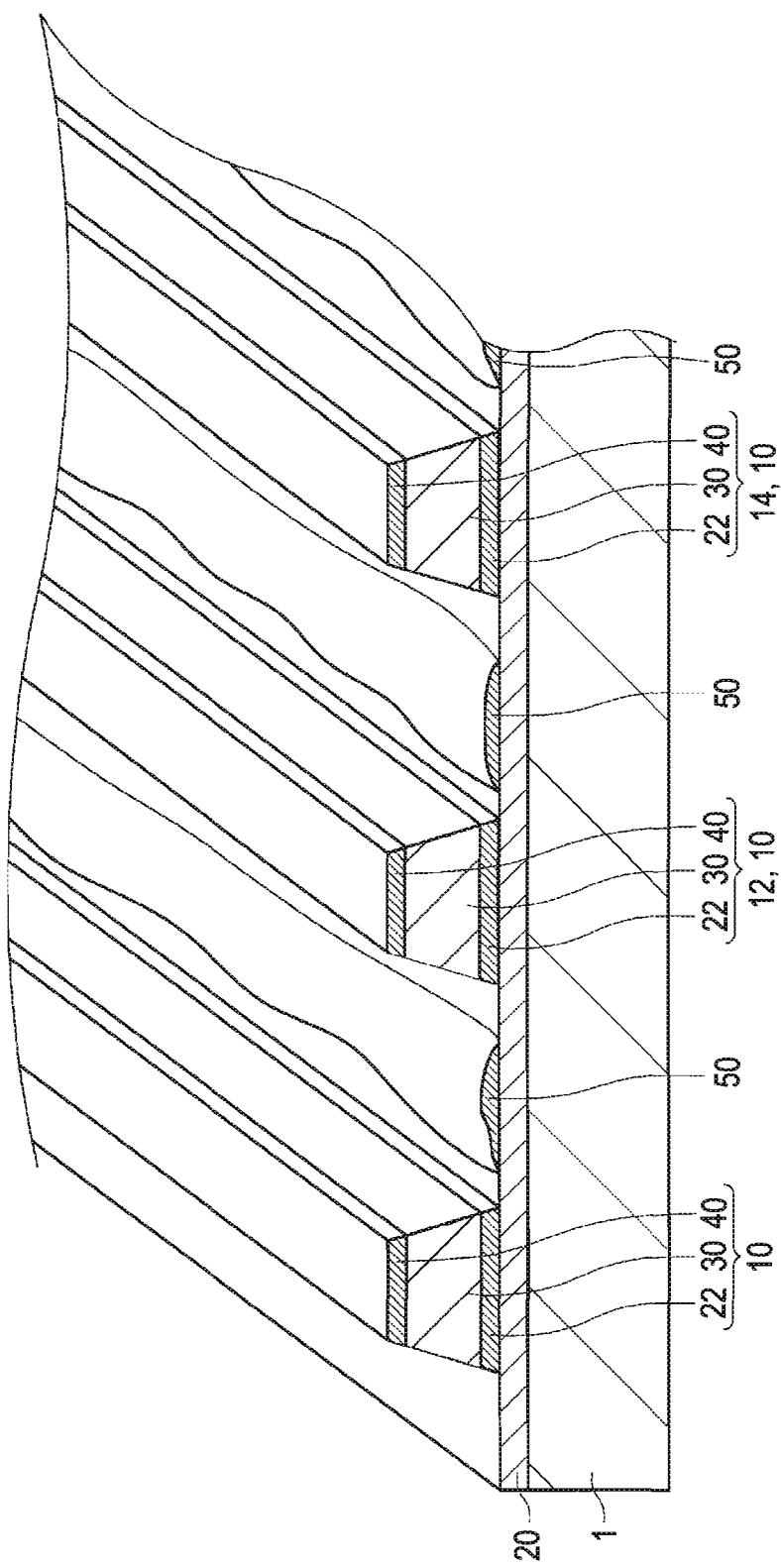
FIG. 4 is a schematic sectional view showing the method for manufacturing the piezoelectric element according to the embodiment.

A method for manufacturing the piezoelectric element of the present embodiment will now be described with reference to some drawings. FIGS. 3 and 4 are schematic sectional views showing a manufacturing method of the piezoelectric element 100 of the present embodiment.

As shown in FIG. 3, the first electrode 20 and a conductive material layer 22a are formed over the substrate 1 by sputtering, plating, vacuum vapor deposition, or the like, and then patterning is performed by, for example, photolithography and etching.

Subsequently, a piezoelectric material layer 30a and a conductive material layer 40a are formed. The piezoelectric material layer 30a can be formed by, for example, a sol-gel method, chemical vapor deposition (CVD), metal organic deposition (MOD), sputtering, or laser ablation. The piezoelectric material layer 30a may be formed by spin coating. The conductive material layer 40a can be formed by sputtering, plating or vacuum vapor deposition. The piezoelectric material layer 30a may be heat-treated to be crystallized.

As shown in FIG. 4, the conductive material layers 22a and 40a and the piezoelectric material layer 30a are patterned into the conductive layers 22, the piezoelectric layers 30, and the second electrodes 40. The patterning is performed by, for example, photolithography and etching.

For example, this etching operation is performed so that a thickness distribution obtained from the striation (variation in thickness) of the piezoelectric material layer 30a can be reflected in the conductive material layer 22a by adjusting the degree of over-etching. Thus, the conductive material layer 22a remains partially on the surface of the first electrode 20 between the multilayer composites 10, thereby forming the oxide films 50.

Alternatively, the oxide films 50 may be formed in a process in which patterning is performed by dry etching using a micro loading effect (phenomenon in which the etching speed depends on the density of the pattern) so that the conductive material layer 22a can remain partly on the surface of the first electrode 20 between the multilayer composites 10. Also, the patterning of the conductive material layer 22a for forming the oxide films 50 may be performed by photolithography and etching.

As shown in FIG. 1, the covering layer 60 is formed so as to cover at least the side surfaces of the multilayer composites 10, the surface 20a of the first electrode 20 between the multilayer composites 10 and the oxide films 50. The covering layer 60 can be formed by, for example, forming a layer by spin coating, sputtering, or the like, and patterning the layer. The patterning is performed by, for example, photolithography and etching. Before forming the covering layer 60, an external terminal (not shown) may be formed on the first electrode 20. By the above-described operation of patterning the conductive material layers 22a and 40a and the piezoelectric material layer 30a, the surface of the first electrode 20 is provided with regions on which the oxide film 50 is not disposed. Consequently, the oxidation of the external terminal by the oxide film 50 can be prevented, and thus the external terminal can be formed on the first electrode 20 with a low resistance.

Through the above operations, the piezoelectric element 100 can be manufactured.

The resulting piezoelectric element 100 can exhibit high reliability.

3. Modifications of Piezoelectric Element

Piezoelectric elements according to modifications of the above embodiment will now be described with reference to some drawings. The same parts of the piezoelectric element as in the piezoelectric element 100 of the above embodiment are designated by the same reference numerals, and description thereof is omitted.

(1) First Modification

Figure 5:
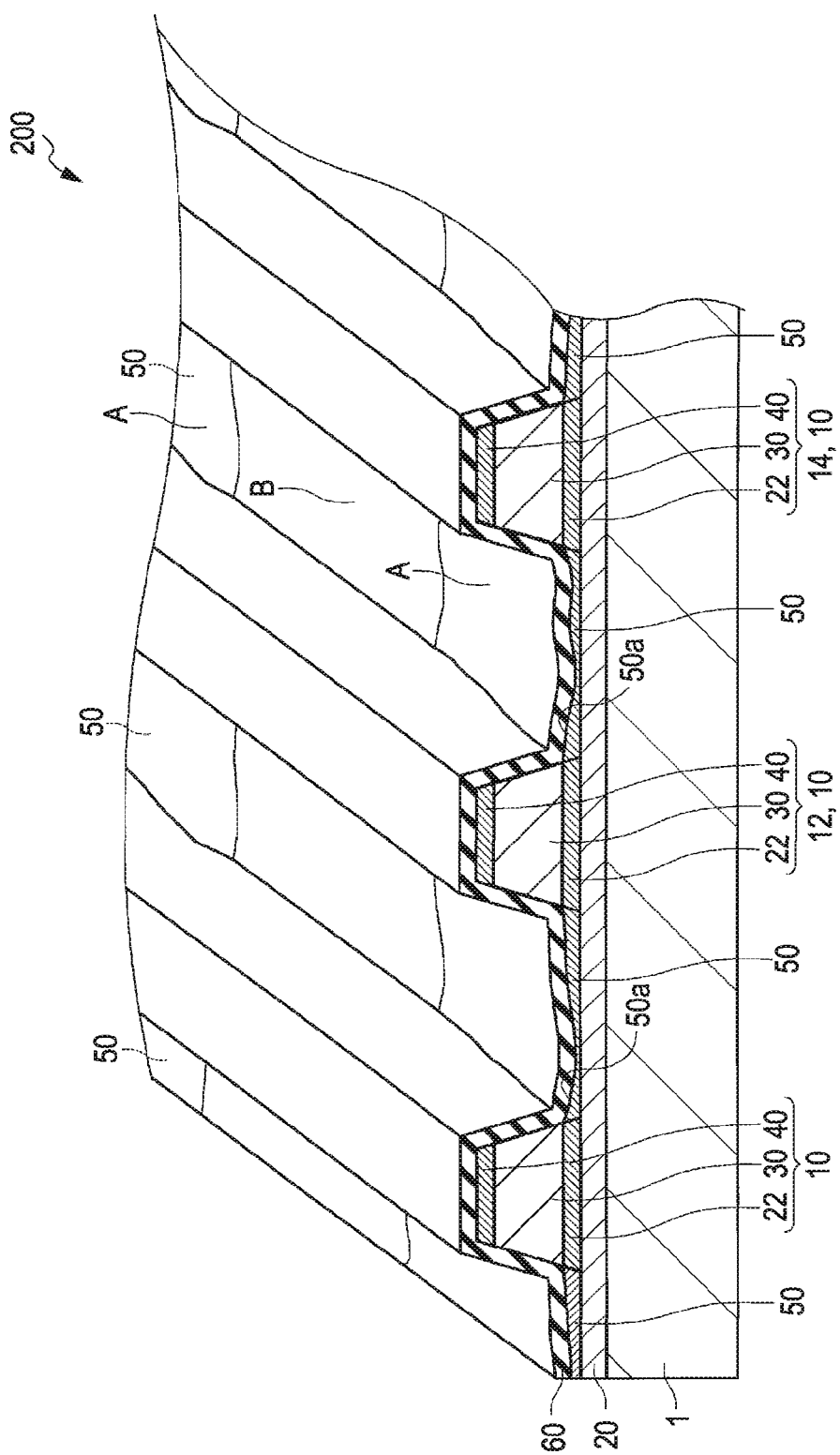
FIG. 5 is a schematic sectional view of a piezoelectric element according to a first modification of the embodiment of the invention.

A first modification will now be described. FIG. 5 is a schematic sectional view of a piezoelectric element 200 according to the first modification.

The oxide films 50 of the piezoelectric element 200 are in contact with the multilayer composites 10 (conductive layers 22), as shown in FIG. 5. In the modification shown in FIG. 5, each oxide films 50 is formed so as to connect adjacent multilayer composites 10 (for example, the first multilayer composite 12 and the second multilayer composite 14). One side of the first multilayer composite 12 and one side of the second multilayer composite 14 are connected with the inclines 50a of the oxide film 50. The oxide films 50 may be formed in strips, as shown in FIG. 5. The presence of the oxide film 50 defines region A where the covering layer 60 and the oxide film 50 are in contact with each other between the multilayer composites 10, and region B where the covering layer 60 and the first electrode 20 are in contact with each other.

Since the piezoelectric element 200 of the present modification has the oxide films 50 partly on the surface of the first electrode 20 between the multilayer composites 10, it can produce the same effect as the piezoelectric element 100 of the foregoing embodiment.

(2) Second Modification

Figure 6:
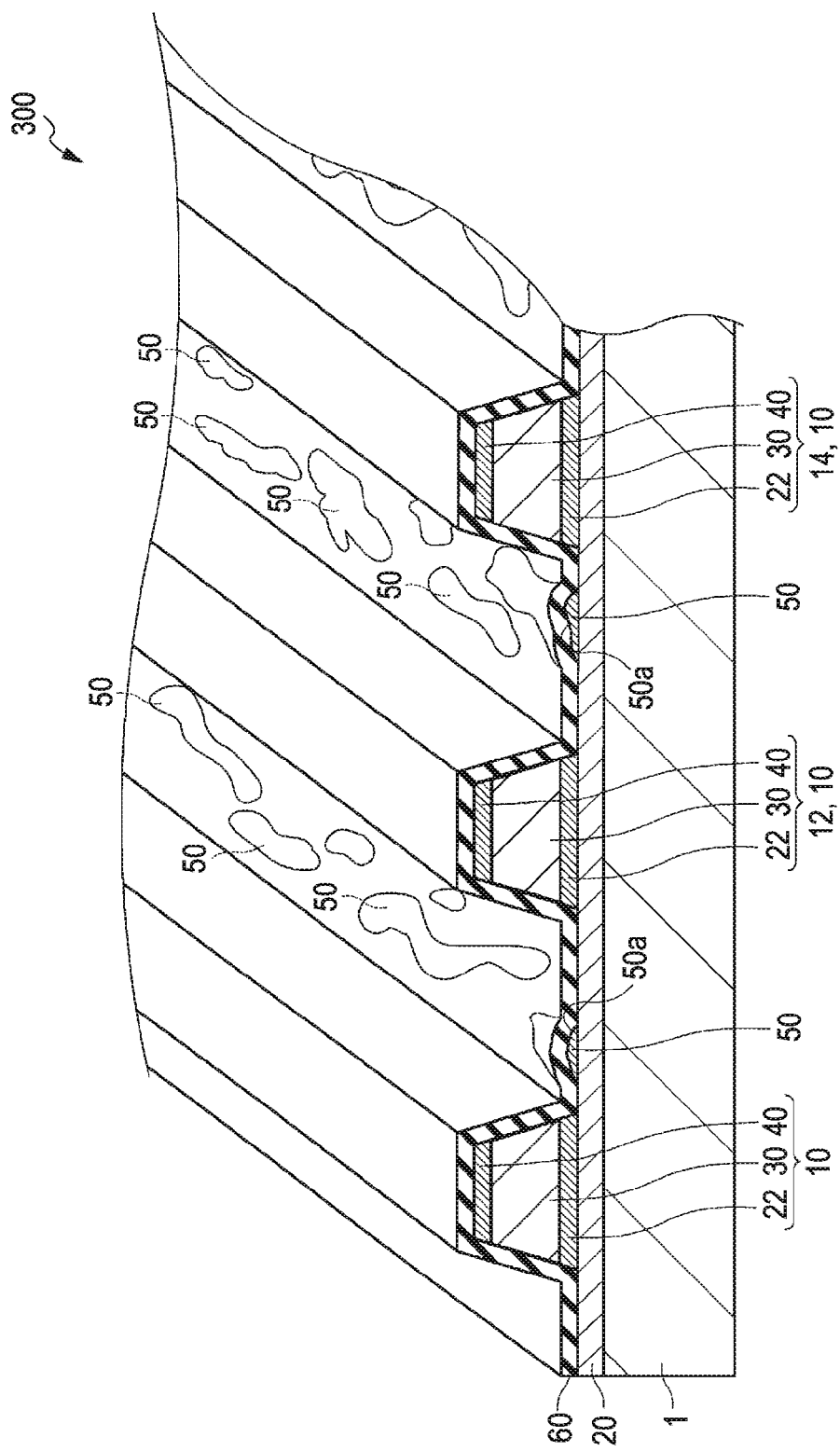
FIG. 6 is a schematic sectional view of a piezoelectric element according to a second modification of the embodiment of the invention.

A second modification will now be described. FIG. 6 is a schematic sectional view of a piezoelectric element 300 according to the second modification.

In the piezoelectric element 300, a plurality of oxide films 50 are formed in each region between the multilayer composites 10 (for example, between the first multilayer composite 12 and the second multilayer composite 14) on the surface of the first electrode 20, as shown in FIG. 6. The shape of the oxide films 50 is not particularly limited. Although the oxide films 50 shown in FIG. 6 have different shapes, they may have the same shape. The oxide films 50 may be separate from the multilayer composites 10, or may be in contact with the multilayer composites 10. The oxide films 50 are in a random arrangement.

Since the piezoelectric element 300 of the present modification has the oxide films 50 partly on the surface of the first electrode 20 between the multilayer composites 10, it can produce the same effect as the piezoelectric element 100 of the foregoing embodiment.

(3) Third Modification

Figure 7:
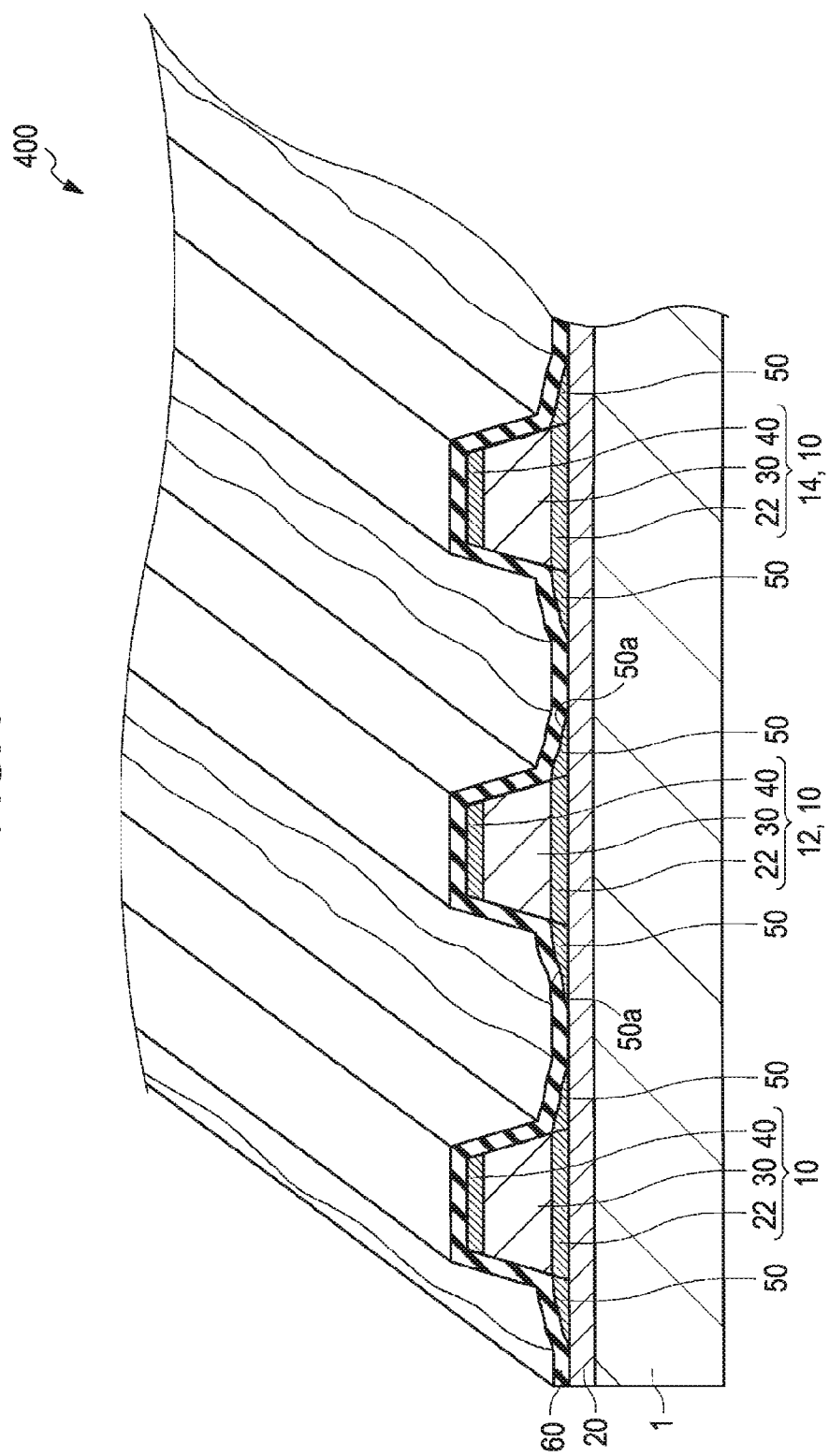
FIG. 7 is a schematic sectional view of a piezoelectric element according to a third modification of the embodiment of the invention.

A third modification will now be described. FIG. 7 is a schematic sectional view of a piezoelectric element 400 according to the third modification.

The oxide films 50 of the piezoelectric element 400 are in contact with the multilayer composites 10, and are tapered in such a manner that the thickness is reduced as the distance from the multilayer composite 10 is increased. The tapered surface defining the shape of the oxide film may be an incline 50a. The side surfaces of the multilayer composites 10 and the first electrode 20 are connected with the inclines 50a. Each oxide film 50 extends along the length of the multilayer composite 10.

Since the piezoelectric element 400 of the present modification has the oxide films 50 partly on the surface of the first electrode 20 between the multilayer composites 10, it can produce the same effect as the piezoelectric element 100 of the foregoing embodiment.

(4) Fourth Modification

Figure 8:
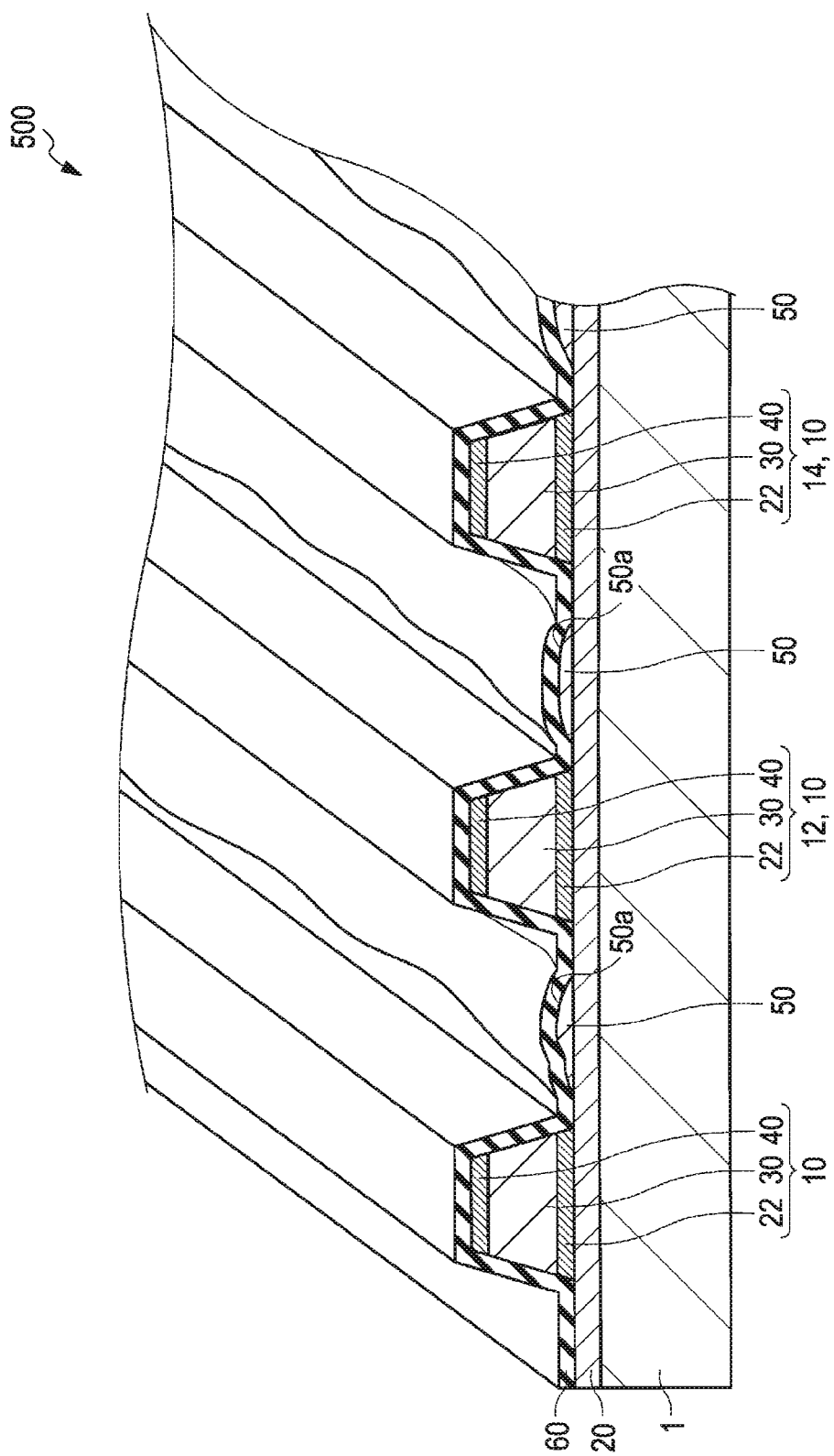
FIG. 8 is a schematic sectional view of a piezoelectric element according to a fourth modification of the embodiment of the invention.

A fourth modification will now be described. FIG. 8 is a schematic sectional view of a piezoelectric element 500 according to the fourth modification.

The oxide films 50 of the piezoelectric element 100 shown in FIG. 1 are made of the same material as the conductive layer 22. In the fourth modification, the oxide films 50 of the piezoelectric element 500 are made of the same material as the piezoelectric layer 30.

The oxide film 50 of the piezoelectric element 500 is made of a perovskite-type oxide expressed by the general formula $ABO_3$ (for example, A may be Pb, and B may be Zr and Ti). These materials have higher adhesion to the materials that can be used in the covering layer 60, such as silicon oxide ($SiO_2$), aluminum oxide ($Al_2O_3$) and known organic materials, than noble metals that can be used in the first electrode 20. Accordingly, in the piezoelectric element 500, the adhesion between the covering layer 60 and the oxide films 50 is increased to ensure high reliability. The oxide film 50 may have a multilayer structure including, in this order from below, a layer made of the same material as the conductive layer 22 and a layer made of the same material as the piezoelectric layer 30. The piezoelectric element 500 of the present modification need not necessarily have the conductive layer 22.

For example, the oxide films 50 are formed in a process in which the conductive material layers 22a and 40a and the piezoelectric material layer 30a are patterned so that the piezoelectric material layer 30a remains on the surface of the first electrode 20 between the multilayer composites 10 by adjusting the agree of over-etching or the micro loading effect.

Thus, the piezoelectric layers 30 and the oxide films 50 of the piezoelectric element 500 can be formed in the same process step, and, accordingly, the manufacturing process can be simplified.

Since the piezoelectric element 500 of the present modification has the oxide films 50 partly on the surface of the first electrode 20 between the multilayer composites 10, it can produce the same effect as the piezoelectric element 100 of the foregoing embodiment.

4. Liquid Ejecting Head

Figure 9:
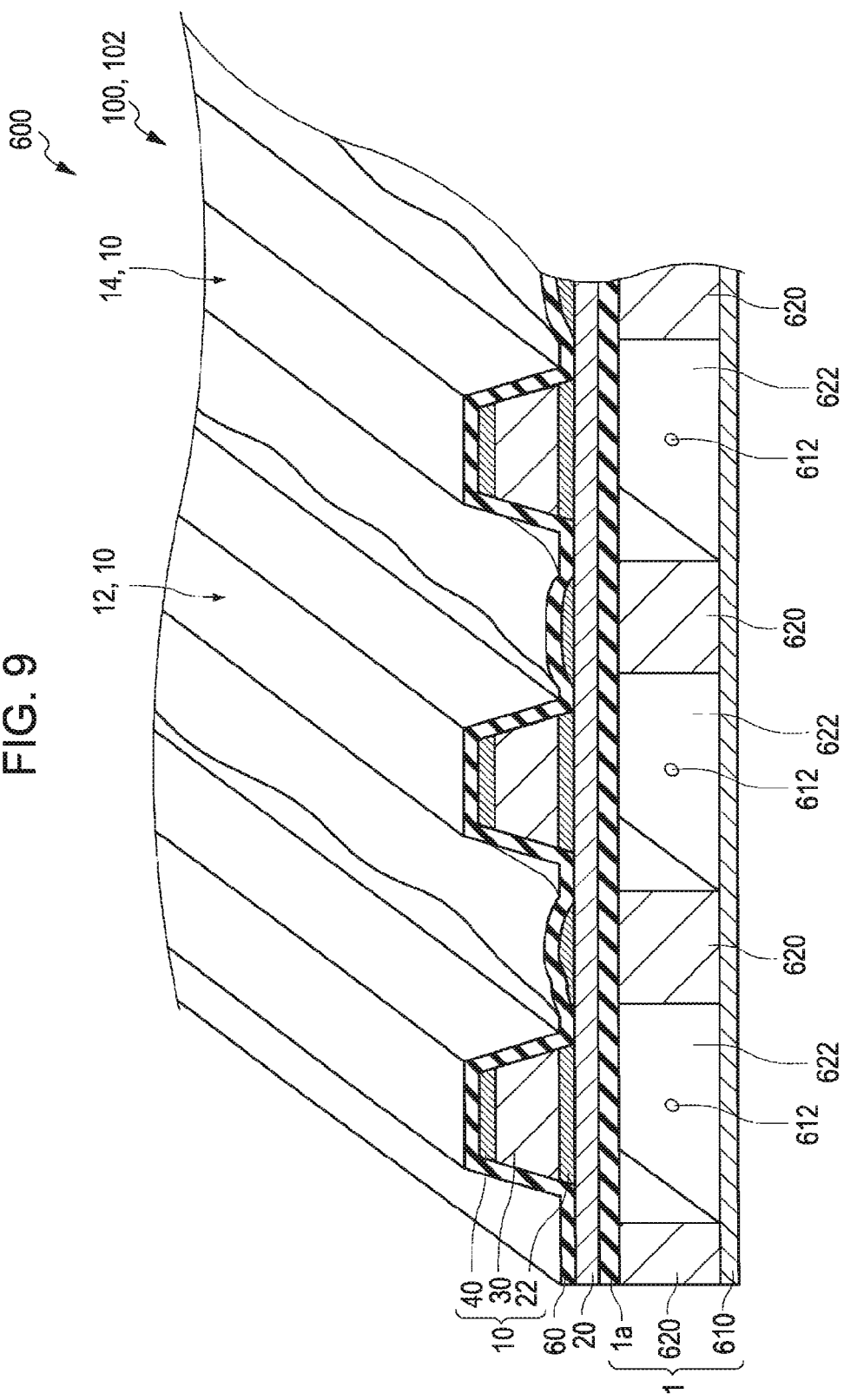
FIG. 9 is a schematic sectional view of a liquid ejecting head according to an embodiment of the invention.
Figure 10:
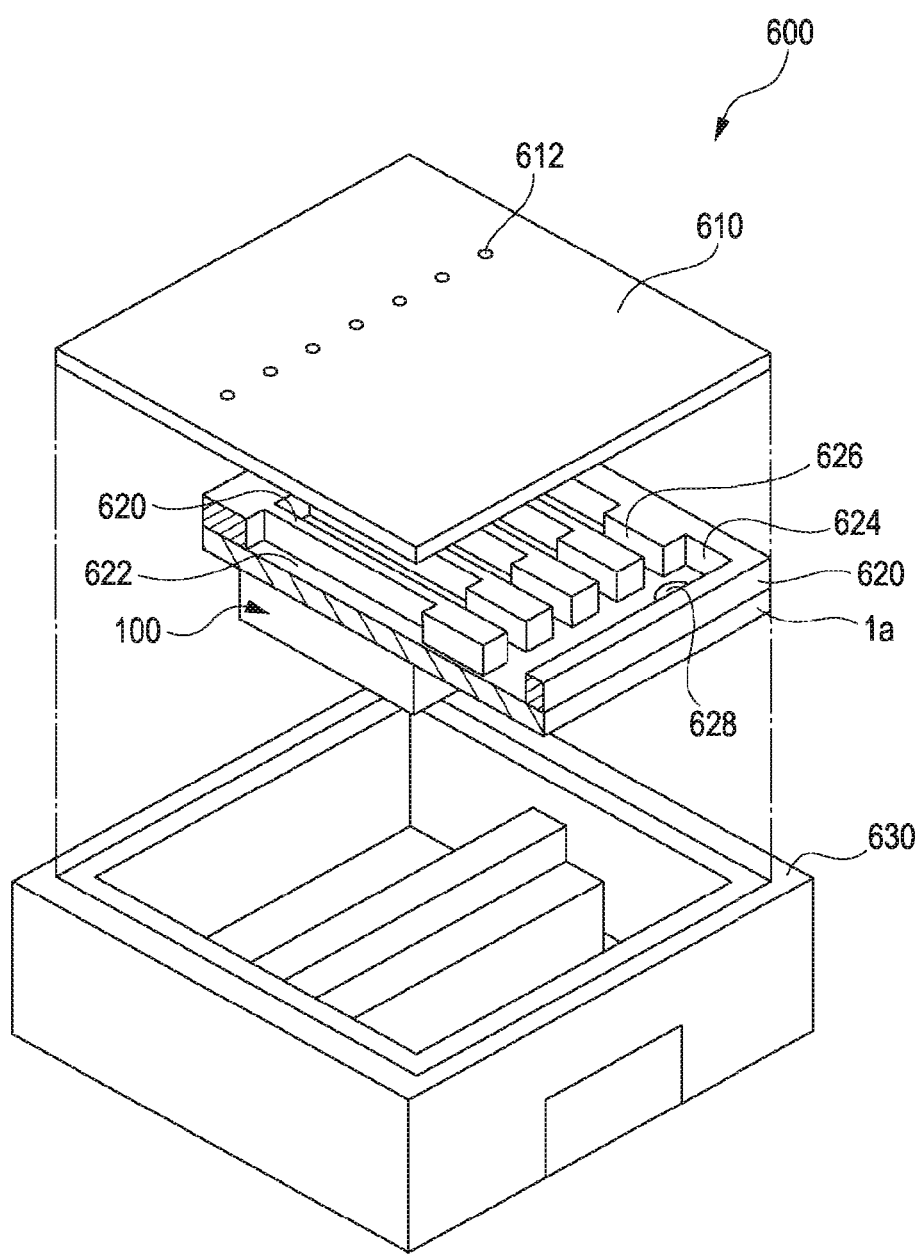
FIG. 10 is an exploded perspective view of the liquid ejecting head according to the embodiment.

A liquid ejecting head 600 will now be described as one of the applications of the piezoelectric element (piezoelectric actuator) according to an embodiment of the invention, with reference to drawings. FIG. 9 is a schematic sectional view corresponding to FIG. 1, showing major parts of the liquid ejecting head 600. FIG. 10 is an exploded perspective view of the liquid ejecting head 600, showing a state where the head is reversed from the normal position.

The liquid ejecting head 600 includes any one of the above-described piezoelectric elements (piezoelectric actuators). In the liquid ejecting head 600 described below, a piezoelectric element 100 is disposed on a substrate 1 (structure including a vibration plate 1*a* at the upper side thereof). The piezoelectric element 100 and the vibration plate 1*a* define a piezoelectric actuator 102. The structure shown in FIGS. 9 and 10, the substrate 1 includes the vibration plate 1*a*, a pressure chamber substrate 620, and a nozzle plate 610.

The liquid ejecting head 600 includes the nozzle plate 610 having nozzle apertures 612, the pressure chamber substrate 620 having pressure chambers 622 therein, and the piezoelectric actuator 102, as shown in FIGS. 9 and 10. In addition, the liquid ejecting head 600 may include an enclosure 630, as shown in FIG. 10. FIG. 10 simply shows the piezoelectric element 100.

The nozzle plate 610 has nozzle apertures 612, as shown in FIGS. 9 and 10. Ink is ejected through the nozzle apertures 612. The nozzle apertures 612 may be aligned in a line in the nozzle plate 610. The nozzle plate 610 may be made of silicon or stainless steel (SUS).

The pressure chamber substrate 620 is disposed on the nozzle plate 610 (under the nozzle plate in FIG. 10). The pressure chamber substrate 620 may be made of, for example, silicon. The pressure chamber substrate 620 divides the space between the nozzle plate 610 and the vibration plate 1*a* so as to form a reservoir (liquid storage portion) 624, delivering paths 626 communicating with the reservoir 624, and pressure chambers 622 communicating with the respective delivering paths 626, as shown in FIG. 10. In the present embodiment, the reservoir 624, the delivering paths 626 and the pressure chambers 622 are described separately. However, they all function as liquid flow channels, and the flow channels can be arbitrarily designed without particular limitation. The delivering paths 626 shown in FIG. 10 are each partially narrowed, but can be formed in any shape according to the design without being limited to such a shape. The reservoir 624, the delivering paths 626 and the pressure chambers 622 are partitioned by the nozzle plate 610, the pressure chamber substrate 620 and the vibration plate 1*a*.

The reservoir 624 can temporally store ink supplied from the outside (for example, an ink cartridge) through a through hole 628 formed in the substrate 1. The ink in the reservoir 624 is delivered to the pressure chambers 622 through the delivering paths 626. The capacity of the pressure chamber 622 is varied by the deformation of the vibration plate 1*a*. The pressure chambers 622 communicate with the corresponding nozzle apertures 612. By varying the capacity of the pressure chamber 622, the ink is ejected through the nozzle aperture 612. The reservoir 624 may be called a manifold.

The piezoelectric element 100 is disposed over the pressure chamber substrate 620 (under the pressure chamber substrate in FIG. 10). The piezoelectric element 100 is electrically connected to a piezoelectric element driving circuit (not shown) so as to be operated (for vibration or deformation) according to the signal from the piezoelectric element driving circuit. The vibration plate 1*a* is deformed by the behavior of the piezoelectric layer 30 to vary the pressure in the pressure chamber 622 as required.

In the structure shown in FIG. 9, the width of the pressure chamber 622 along the width of the second electrode 40 is larger than the width of the piezoelectric layer 30 along the width of the second electrode 40. Hence, the side surfaces of the piezoelectric layer 30 are located to the inner side of the side surfaces of the pressure chamber 622 (defined by the pressure chamber substrate 620 partitioning the pressure chambers 622). Thus, the inner pressure in the pressure chamber 622 can be varied effectively.

The enclosure 630 accommodates the nozzle plate 610, the pressure chamber substrate 620 and the piezoelectric element 100, as shown in FIG. 10. The enclosure 630 can be made of, for example, a resin or a metal.

The liquid ejecting head 600 includes the above-described reliable piezoelectric element 100. Accordingly, the liquid ejecting head 600 can exhibit high reliability.

In the above description, an ink jet recording head have been illustrated as an embodiment of the liquid ejecting head 600. However, the liquid ejecting head may be used as a color material ejecting head used for manufacturing color filters of liquid crystal displays or the like, an electrode material ejecting head used for forming electrodes of organic EL displays or field emission displays (FEDs), or a bioorganic material ejecting head used for manufacturing bio-chips.

5. Liquid Ejecting Apparatus

Figure 11:
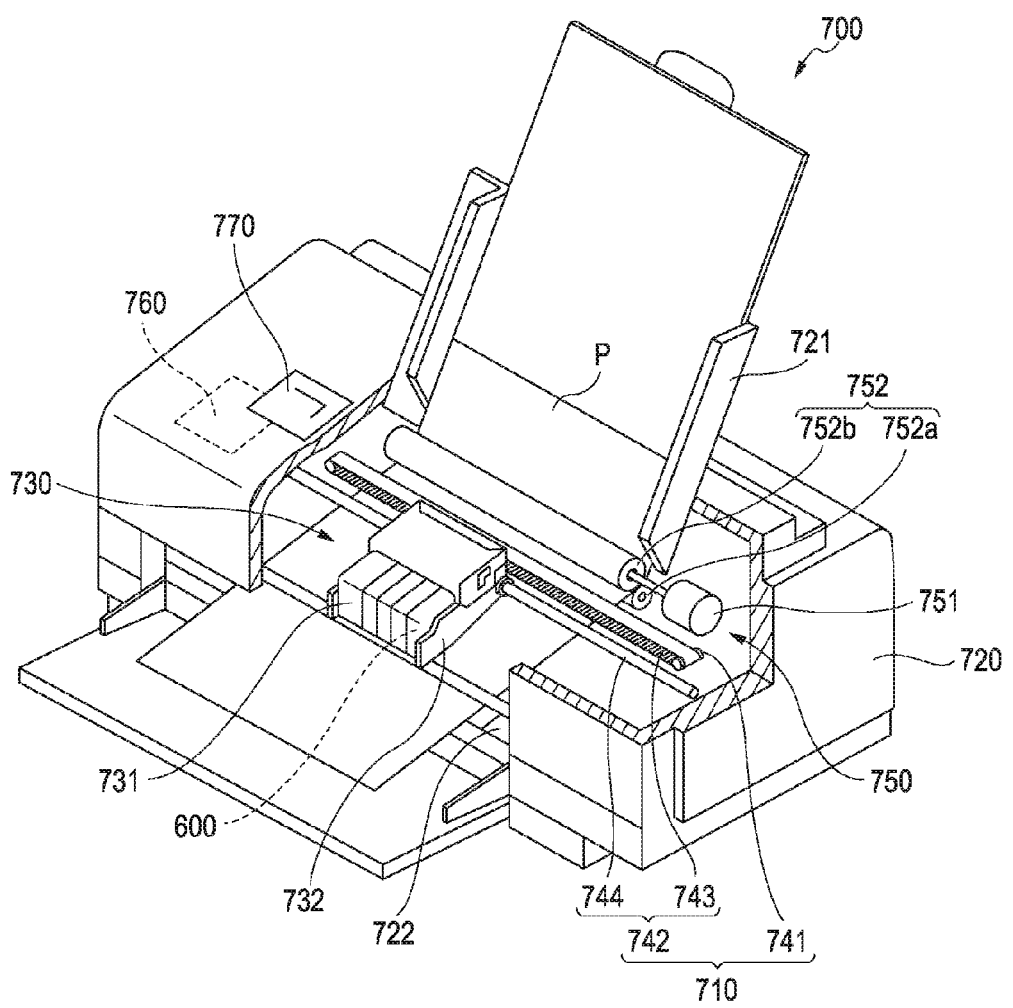
FIG. 11 is a schematic perspective view of a liquid ejecting apparatus according to an embodiment of the invention.

A liquid ejecting apparatus according to an embodiment of the invention will now be described with reference to a drawing. The liquid ejecting apparatus includes the above-described liquid ejecting head. In the following description, the liquid ejecting apparatus functions as an ink jet printer including the liquid ejecting head 600. FIG. 11 is a schematic perspective view of the liquid ejecting apparatus 700 of an embodiment of the invention.

The liquid ejecting apparatus 700 includes a head unit 730, a driving section 710, and a control section 760, as shown in FIG. 11. The liquid ejecting apparatus 700 may further include an apparatus body 720, a paper feeding section 750, a tray 721 on which recording paper P is placed, a paper ejecting port 722 from which the recording paper P is ejected, and a control panel 770 disposed on the upper surface of the apparatus body 720.

The head unit 730 includes an ink jet recording head (hereinafter may be simply referred to as the head) including the liquid ejecting head 600. The head unit 730 further includes an ink cartridge 731 from which an ink is delivered to the head, and a transport portion (carriage) 732 on which the head and the ink cartridge 731 are disposed.

The driving section 710 reciprocally moves the head unit 730. The driving section 710 includes a carriage motor 741 acting as a driving source of the head unit 730, and a reciprocal movement mechanism 742 allowing the head unit 730 to be reciprocally moved by the rotation of the carriage motor 741.

The reciprocal movement mechanism 742 includes a carriage guide shaft 744 whose ends are held by a frame (not shown), and a timing belt 743 extending in parallel with the carriage guide shaft 744. The carriage guide shaft 744 supports the carriage 732 so as to allow the reciprocal movement of the carriage 732. The carriage 732 is secured to part of the timing belt 743. When the timing belt 743 is moved by the operation of the carriage motor 741, the head unit 730 reciprocally moves along the carriage guide shaft 744. The head ejects ink during the reciprocal movement to print on the recording paper P.

In the liquid ejecting apparatus of the present embodiment, printing is performed while both the liquid ejecting head 600 and the recording paper P are moving. However, only either the liquid ejecting head 600 or the recording paper P may move, as long as the liquid ejecting head 600 can perform recording on paper P while the positions of the head 600 and the recording paper P are relatively changed. In the present embodiment, printing is performed on the recording paper P. However, the recording medium on which the liquid ejecting apparatus prints is not limited to paper, and it can be appropriately selected from a wide range of media including cloth, plastic sheets, and metal sheets.

The control section 760 can control the head unit 730, the driving section 710 and the paper feeding section 750.

The paper feeding section 750 feeds recording paper P toward the head unit 730 from the tray 721. The paper feeding section 750 includes a paper feeding motor 751 acting as a driving source, and paper feeding rollers 752 rotated by the operation of the paper feeding motor 751. The paper feeding rollers 752 include a driven roller 752a and a driving roller 752b vertically opposing each other between which the recording paper P is fed. The driving roller 752b is coupled with the paper feeding motor 751. When the paper feeding section 750 is driven by the control section 760, the recording paper P is transported under the head unit 730.

The head unit 730, the driving section 710, the control section 760 and the paper feeding section 750 are disposed within the apparatus body 720.

The liquid ejecting apparatus 700 includes the reliable liquid ejecting head 600. Accordingly, the liquid ejecting apparatus 700 can exhibit high reliability.

Although the liquid ejecting apparatus 700 of the present embodiment includes a single liquid ejecting head 600 that can print on a recording medium, the liquid ejecting head 600 may include a plurality of liquid ejecting heads. If a plurality of liquid ejecting heads are used, they may be independently operated as described above, or may be connected to each other to define a combined single head. Such a combined head may be, for example, a line head in which heads are arranged in such a manner that the nozzle apertures of the heads are aligned at regular intervals.

In the above description, an ink jet printer has been described as an embodiment of the liquid ejecting apparatus 700 of the invention. The liquid ejecting apparatus can also be used in industrial fields. In this instance, the liquid ejected from the apparatus may be a functional material whose viscosity has been adjusted with a solvent or disperse medium. The liquid ejecting apparatus of the embodiments of the invention can be used as color material ejecting apparatuses used for manufacturing color filters of liquid crystal displays, liquid material ejecting apparatuses used for forming electrodes and color filters of organic EL displays, field emission displays (FEDs) and electrophoretic displays, and bioorganic material ejecting apparatuses used for manufacturing biochips, in addition to the above-described recording apparatus or printer.

The embodiment and its modifications described above can be appropriately combined. A combined form of the embodiment and its modifications can produce their effects and a synergistic effect.

While the invention has been described with reference to exemplary embodiments, it is to be understood that various modifications may be made without departing from the new features and effects of the invention. Such modifications are within the scope of the invention.

What is claimed is:

1. A piezoelectric element comprising:
a first electrode containing a noble metal;
a first multilayer composite disposed on the first electrode;
a second multilayer composite disposed on the first electrode at a distance from the first multilayer composite;
an oxide film partly disposed on the surface of the first electrode between the first multilayer composite and the second multilayer composite; and
a covering layer covering the side surfaces of the first and second multilayer composites, and the oxide film and the surface of the first electrode between the first multilayer composite and the second multilayer composite,
wherein the first multilayer composite and the second multilayer composite each include a piezoelectric layer and a second electrode over the piezoelectric layer, and
wherein the first multilayer composite and the second multilayer composite each further include a conductive layer that is disposed between the first electrode and the piezoelectric layer, and the oxide film and the conductive layer are made of the same material.

2. The piezoelectric element according to claim 1, wherein the oxide film includes a film selected from the group consisting of a film containing iridium oxide, a film containing lanthanum and nickel, and a film containing strontium and ruthenium.

3. The piezoelectric element according to claim 1, wherein the oxide film and the piezoelectric layer are made of the same material.

4. The piezoelectric element according to claim 1, wherein the oxide film has an incline defined by continuous changes in the thickness thereof.

5. The piezoelectric element according to claim 1, wherein the oxide film has a projecting shape having an apex, and includes a first portion whose thickness is reduced toward the first multilayer composite from the apex, and a second portion whose thickness is reduced toward the second multilayer composite from the apex, and wherein the first portion has an incline defined by continuous changes in the thickness thereof, and the second portion has an incline defined by continuous changes in the thickness thereof.

6. A piezoelectric actuator comprising the piezoelectric element as set forth in claim 1.

7. A piezoelectric actuator comprising the piezoelectric element as set forth in claim 1.

8. A piezoelectric actuator comprising the piezoelectric element as set forth in claim 2.

9. A piezoelectric actuator comprising the piezoelectric element as set forth in claim 3.

10. A piezoelectric actuator comprising the piezoelectric element as set forth in claim 4.

11. A piezoelectric actuator comprising the piezoelectric element as set forth in claim 5.

12. A liquid ejecting head comprising the piezoelectric actuator as set forth in claim 6.

13. A liquid ejecting head comprising the piezoelectric actuator as set forth in claim 7.

14. A liquid ejecting head comprising the piezoelectric actuator as set forth in claim 8.

15. A liquid ejecting head comprising the piezoelectric actuator as set forth in claim 9.

16. A liquid ejecting head comprising the piezoelectric actuator as set forth in claim 10.

17. A liquid ejecting head comprising the piezoelectric actuator as set forth in claim 11.

18. A liquid ejecting apparatus comprising the liquid ejecting head as set forth in claim 12.

19. A liquid ejecting apparatus comprising the liquid ejecting head as set forth in claim 13.

\* \* \* \* \*